(12) United States Patent
Emerson

(10) Patent No.: US 7,872,268 B2
(45) Date of Patent: Jan. 18, 2011

(54) SUBSTRATE BUFFER STRUCTURE FOR GROUP III NITRIDE DEVICES

(75) Inventor: David T. Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 351 days.

(21) Appl. No.: 11/110,545

(22) Filed: Apr. 20, 2005

(65) Prior Publication Data
US 2005/0236633 A1 Oct. 27, 2005

Related U.S. Application Data

(60) Provisional application No. 60/521,422, filed on Apr. 22, 2004.

(51) Int. Cl.
H01L 33/00 (2010.01)
H01L 31/0312 (2010.01)

(52) U.S. Cl. .......................... 257/94; 257/77; 257/103

(58) Field of Classification Search ............. 257/13–15, 257/77, 79, 88, 89, 94, 103
See application file for complete search history.

(56) References Cited

U.S. PATENT DOCUMENTS

| | | | |
|---|---|---|---|
| 4,866,005 A | 9/1989 | Davis et al. | |
| RE34,861 E | 2/1995 | Davis et al. | |
| 5,389,571 A * | 2/1995 | Takeuchi et al. | 117/89 |
| 5,393,993 A | 2/1995 | Edmond et al. | |
| 5,523,589 A | 6/1996 | Edmond et al. | |
| 5,665,986 A | 9/1997 | Miura et al. | |
| 5,679,965 A | 10/1997 | Schetzina | |
| 5,727,008 A | 3/1998 | Koga | |
| 5,756,374 A | 5/1998 | Miura et al. | |
| 5,786,606 A | 7/1998 | Nishio et al. | |
| 5,874,747 A | 2/1999 | Redwing et al. | |
| 5,923,058 A | 7/1999 | Agarwal et al. | |
| 5,929,466 A | 7/1999 | Ohba et al. | |
| 5,990,495 A | 11/1999 | Ohba | |
| 6,121,121 A | 9/2000 | Koide | |
| 6,187,606 B1 | 2/2001 | Edmond et al. | |
| 6,201,262 B1 | 3/2001 | Edmond et al. | |
| 6,242,764 B1 | 6/2001 | Ohba et al. | |
| 6,284,395 B1 | 9/2001 | Maruska et al. | |
| 6,373,077 B1 | 4/2002 | Edmond et al. | |
| 6,492,193 B1 | 12/2002 | Edmond et al. | |
| 6,495,894 B2 | 12/2002 | Shibata et al. | |
| 6,508,878 B2 | 1/2003 | Kim et al. | |

(Continued)

FOREIGN PATENT DOCUMENTS

EP 1 052 684 11/2000

(Continued)

Primary Examiner—Ori Nadav
(74) Attorney, Agent, or Firm—Myers Bigel Sibley & Sajovec, P.A.

(57) ABSTRACT

A semiconductor photonic device and associated method are disclosed. The device includes a substrate and a buffer structure on the substrate. The buffer structure is formed of a discontinuous layer of aluminum gallium nitride and a gallium nitride layer on the aluminum gallium nitride layer having a thickness that functionally minimizes the number of defects propagated through it. At least two doped Group III nitride layers are on the buffer structure, with the layers being of opposite conductivity type from one another for providing electrons and holes that combine to generate an emission from the device when current is applied to the device.

28 Claims, 1 Drawing Sheet

U.S. PATENT DOCUMENTS

| | | |
|---|---|---|
| 6,606,335 B1 | 8/2003 | Kuramata |
| 6,630,690 B2 | 10/2003 | Edmond et al. |
| 2002/0008241 A1 | 1/2002 | Edmond et al. |
| 2002/0022290 A1 | 2/2002 | Kong et al. |
| 2002/0098693 A1 | 7/2002 | Kong et al. |
| 2003/0006418 A1 | 1/2003 | Emerson et al. |
| 2003/0020061 A1 * | 1/2003 | Emerson et al. ............... 257/14 |

FOREIGN PATENT DOCUMENTS

| | | |
|---|---|---|
| WO | WO 99/65068 | 12/1999 |

* cited by examiner

SUBSTRATE BUFFER STRUCTURE FOR GROUP III NITRIDE DEVICES

This application claims priority from application Ser. No. 60/521,422 filed Apr. 22, 2004. This application is related to application Ser. No. 10/140,796 filed May 7, 2002 for "Group III Nitride Based Light Emitting Diode Structures With A Quantum Well And Superlattice, Group III Nitride Based Quantum Well Structures And Group III Nitride Based Superlattice Structures," published as No. 20030006418, the contents of which are incorporated entirely herein by reference.

BACKGROUND

The present invention relates to light emitting diodes and related structures (lasers and UV emitting diodes) that are formed from Group III nitride compounds using silicon carbide or other suitable substrates such as sapphire or GaN for the devices.

The present invention is an improved buffer structure for Group III nitride devices, particularly photonic devices, formed on silicon carbide substrates. An excellent background (and more) discussion on photonic devices is set forth in Sze, PHYSICS OF SEMICONDUCTOR DEVICES, Chapter 12, page 681ff (1981), John Wiley & Sons, Inc. As set forth therein, there are several categories of photonic devices. The present invention will be described in terms of light emitting diodes, with the understanding that the invention can be incorporated as well with the other types of devices.

The use of Group III nitrides as active layers in light emitting devices is set forth in the co-pending incorporated references as well as other sources in this art. Because to date the bulk growth of Group III nitrides has proven difficult and has not reached widespread commercial availability, Group III nitride devices are typically formed on other substrates of which the two most common in commercial versions are silicon carbide (SiC) and sapphire ($Al_2O_3$). Although the present invention can be incorporated with sapphire substrates, the present specification will speak mainly in terms of silicon carbide as being the preferred and most convenient way to describe both the background and the invention itself.

In many circumstances silicon carbide is preferred for a substrate material because it can be conductively doped. Silicon carbide differs from sapphire in such respect because sapphire cannot be conductively doped. Accordingly, devices incorporated on sapphire must have some sort of laterally based structure to accommodate the respective ohmic contacts that inject current through the device. In contrast, because silicon carbide is conductive, the ohmic contacts can be placed at opposite ends of the device, an orientation that is referred to in the art as "vertical." In many circumstances and devices, such a vertical orientation offers design and production advantages. Silicon carbide also offers a number of physical and electronic advantages, such as a wide bandgap, a high melting point, a high thermal conductivity, a high breakdown electric field, and other factors well understood in this art that make it an attractive candidate material for substrates and devices.

As a different compound from gallium nitride or any other Group III nitride, however, the crystal lattice parameters of silicon carbide are different from the crystal lattice parameters of the Group III nitrides, taken either individually (i.e. binary compounds), or in their various ternary or quaternary combinations. Thus, when Group III nitride layers are formed into devices on silicon carbide substrates, some accommodation must be made to help provide a transition between the crystal structure of silicon carbide and the crystal structure of the Group III nitrides. As is well understood by those of ordinary skill in this art, lattice mismatches can cause defects (some of which are referred to as "dislocations") that propagate through the respective layers of a device and degrade its performance. If severe enough, such defects can render the device inoperable.

Accordingly, transition structures referred to as "buffers" (or "buffer layers") are almost always included in Group III nitride devices on SiC substrates.

Buffer structures of various types have been disclosed in the art. Exemplary ones are set forth in commonly assigned U.S. Pat. Nos. 5,523,589 and 5,393,993, as well as in the co-pending applications incorporated herein by reference. Because of the continued interest in and importance of Group III nitrides in photonic devices however, there remains a need and interest in obtaining buffer structures and buffer growth techniques that offer constant improvement in this area.

SUMMARY

In one aspect the invention is a buffer structure formed of a relatively thin, discontinuous layer of aluminum gallium nitride on the relevant semiconductor substrate, and a relatively thick layer of gallium nitride on the discontinuous layer of aluminum gallium nitride.

In another aspect, the invention is a method of forming the buffer structure in which a relatively thin layer of aluminum gallium nitride is formed on a semiconductor substrate, following which a gallium nitride layer is grown on the aluminum gallium nitride layer at a temperature that favorably encourages lateral growth of the gallium nitride on the AlGaN layer while discouraging nucleation of GaN on the semiconductor substrate.

Some of the objects of the invention having been stated, other objects will appear as the description proceeds when taken in connection with the accompanying drawings.

DETAILED DESCRIPTION

Figure 1:
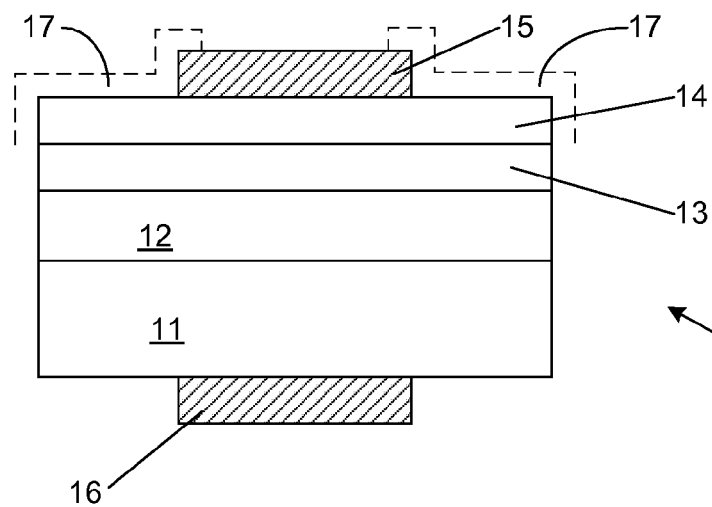
FIG. 1 is a cross-sectional schematic diagram of the basic elements of a light emitting diode that includes a buffer layer (and generally represents the basic elements of the prior art).

The basic elements of a photonic device of the type with which the present invention is most useful is illustrated in FIG. 1. The device is broadly designated at 10 and includes a conductive silicon carbide substrate 11, an appropriate buffer structure 12, and at least two doped layers 13 and 14 respectively that are of opposite conductivity type from one another and that provide the electrons and holes that combine to generate the diode's emission. Further, the structure can include an additional layer or series of layers 17 consisting of a suitable dielectric such as $Si_xN_y$ in order to provide electrical passivation and mechanical protection. The device 10 illustrated in FIG. 1 has a vertical orientation with one ohmic contact 15 to one end of the device, and the other ohmic contact 16 made to the conductive substrate 11.

In practice, light emitting diodes that incorporate Group III nitrides generally incorporate additional layers beyond the basic ones illustrated schematically in FIG. 1. For example, and as described in the incorporated copending applications, the structure can include a superlattice that encourages and supports good crystal growth and better transitions between and among the layers of the device. The structure can also include a single quantum well or multiple quantum wells (MQWS) for increasing the efficiency of the device by progressively collecting the carriers in the multiple quantum wells. Because structural features such as the superlattice and multiple quantum wells are well described and set forth in the copending incorporated applications, and are also well understood in this art, they will not be discussed in any further detail herein. Those of ordinary skill in this art, however, will be able to incorporate the present invention along with such structures into photonic devices without undue experimentation.

Figure 2:
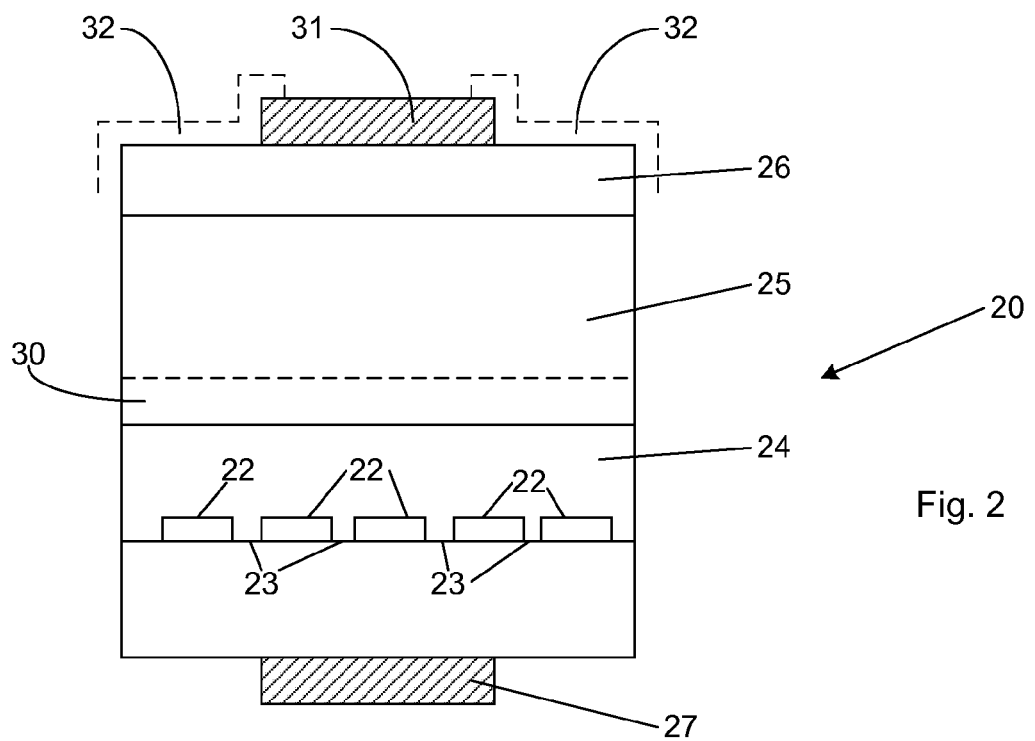
FIG. 2 is cross-sectional schematic diagram of the buffer structure of the present invention.

Accordingly, turning to the invention in detail, FIG. 2 illustrates in cross-sectional schematic fashion the structural aspects of the present invention. In FIG. 2, the overall structure is broadly designated at 20 and is formed upon the conductive silicon carbide substrate 21. The growth and preparation of such a substrate is generally well understood in this art, but exemplary techniques are set forth, for example in U.S. Pat. No. 4,866,005 and its reissue No. Re34,861. Sapphire ($Al_2O_3$) substrates have also been successfully incorporated with the invention and it is expected that gallium nitride (GaN) substrates will also be acceptable and advantageous.

The substrate 21 carries a discontinuous layer of aluminum gallium nitride (AlGaN), which is schematically diagramed in FIG. 2 as the small rectangles 22. It will be understood that the small rectangles are schematic only, and not representative of the actual shape or geometry of the discontinuous aluminum gallium nitride layer. As used herein, and as is often conventional with respect to Group III nitrides, the abbreviation AlGaN refers to the full formula $Al_xGa_{1-x}N$ in which $1>=X>=0$; i.e., the buffer can consist of GaN, AlN, or any combination of GaN and AlN. In the present invention, the mole fraction of aluminum ("X" in the formula) is selected so as to be large enough to facilitate initial nucleation of the AlGaN layer 22 on the substrate, but less than the amount that would cause a continuous layer of AlGaN to form prior to deposition of GaN layer 24. This mole fraction is selected both as a result of particular deposition conditions and substrate selected. For example, in exemplary embodiments where SiC is the chosen substrate, X is preferably between about 0.02 and 0.30, with X equal to 0.10 being most preferred. AlGaN with a non-zero AlN component is necessary because AlN has a higher affinity for bonding to SiC relative to bonding to itself when compared with GaN. Thus, by choosing X greater than or equal to about 0.02, the buffer will sufficiently wet the growth surface to provide a suitable template on which the subsequent GaN layer may be deposited. Values less than 0.02 have a tendency to 'ball-up' and provide a less suitable buffer for the subsequent GaN growth, with the most likely result being non-coalescence in the subsequent GaN layer. However, AlGaN buffers with too high an AlN component tend to promote too high a stress in the epitaxial layer stack and lead to cracking in the epitaxial film. In short, in the case of the AlGaN buffer on SiC, layers with X less than roughly 0.02 or greater than roughly 0.30 tend to promote either non-coalescence or cracking in layers deposited subsequently to layer 22. Nevertheless, layer 22 with X less than 0.02 or greater than 0.30 can be used by suitably modifying the growth parameters.

Because the AlGaN layer 22 serves the purpose of providing a suitable template for the nucleating of lateral growth of GaN, it needs to be thick enough to do so, but otherwise can be relatively thin. Stated functionally, the AlGaN layer 22 needs to be thick enough to provide a surface discrimination between itself and the underlying substrate 21 with respect to the nucleation of GaN on the respective surfaces. Once such a thickness exists, however, no functional reason exists for the AlGaN layer 22 to be any thicker, and a too-great thickness will simply mimic a full AlGaN epitaxial layer and thus eliminate the functional advantages of the invention. Thus, in preferred embodiments, the AlGaN layer 22 is between about 500 and 10000 Å thick, for example about 1500 Å. The optimum thickness of this layer is a function of, for example, the Al mole fraction X and the growth temperature of the layer.

Following deposition of the discontinuous aluminum nitride layer 22, and as described in more detail with respect to the method aspects of the invention, the next portion of the device is the gallium nitride layer 24. The gallium nitride layer 24 is grown to a thickness that functionally helps minimize the number of defects propagated through it and provides a uniform, planar surface for the growth the active and other supporting layers of the device. In general, when the growth, as described in the method aspect herein, is carried out successfully, a thicker layer will tend to produce fewer defects than a thinner layer, because the number of defects decreases as the thickness increases. However, making the layer 24 overly thick will result in cracking or other defect formation in the final epitaxial layer stack. Once the gallium nitride layer 24 has reached an appropriate thickness to reduce the defect density to the amount required or desired, it need not be grown any thicker, and this provides a functional conclusion of the layer's growth. In typical and preferred embodiments, the gallium nitride layer 24 is between about 5000 and 50000 angstroms (Å) thick, with a thickness of about 25000 Å being a good example.

As set forth earlier, the remaining elements of a photonic device are generally well understood in the art, and one or more of such elements are illustrated by the dashed line portions 25 and 26 in FIG. 2. As noted above, these can include a superlattice, multiple quantum wells, individual active layers, or any other structural feature. The advantage of the invention is that when layers 25 and 26 (or the plurality of layers that they represent) are incorporated on the buffer structure of the invention, they are expected to be of generally higher quality, and thus, produce a higher quality device than when such portions are formed on previous buffer structures in the art. FIG. 2 also illustrates that the device can include a superlattice schematically designated at 30, a second ohmic contact 31, and one or more dielectric layers 32.

The advantages of the invention are to a great extent fostered by the method of growing both the discontinuous AlGaN layer 22 and the overlying gallium nitride layer 24. The buffer structure is grown in two basic steps. First the AlGaN layer 22 is grown a temperature of around 900° degrees centigrade with the growth temperature an adjustable parameter selected to promote proper formation of the discontinuous AlGaN buffer. Once the discontinuous layer has been grown to a thickness of about 1500 A, the gallium nitride layer 24 is grown in a relatively hot fashion. The "hot" temperature is selected to be high enough to prevent the GaN from nucleating on the substrate, and low enough to encourage the GaN to nucleate on the AlGaN layer 22, but not so high as to foster an overly-fast GaN lateral growth rate at the expense of lower crystal quality. Thus, the "hot" temperature is preferably between about 1000 and 1200° C., and most preferably about 1100° C. The desired temperature fosters relatively rapid lateral growth (i.e. parallel to the surface of the substrate 21) of GaN across the AlGaN discontinuous layer 22. The rapid lateral growth of gallium nitride is preferred because of the manner in which defects are propagated—and prevented from being propagated—from the silicon carbide substrate 21. In particular, defects on the surface of the substrate 21 tend to be propagated vertically (i.e., perpendicular to the substrate surface) into the aluminum gallium nitride discontinuous layer 22 and then into the GaN continuous layer 24. Thus, the function of the aluminum gallium nitride in the present invention differs somewhat from the use of silicon nitride discontinuous layers (e.g., in the incorporated references) in which the silicon nitride tends to block the defects.

In the present invention, even though the aluminum gallium nitride tends to propagate the defects, the hot growth of gallium nitride tends to discourage gallium nitride from nucleating on the substrate surface portions 23 and to instead nucleate on the AlGaN portions 22 from which it tends to grow laterally (i.e., parallel to the surface) rather than vertically. Such lateral growth tends to avoid propagating defects in the manner in which vertical growth would propagate those defects.

The buffer of the present invention can replace other types of buffer structures, including those set forth in the incorporated co-pending references. Using a SiC substrate as an example, there are at least three instances in which this buffer could be used advantageously. 1) The buffer structure of the invention reduces the voltage at the SiC—GaN interface to a greater extent than do the gallium nitride dots capped with aluminum gallium nitride and followed by a continuous AlGaN layer set forth in the incorporated references. 2) The buffer structure of the invention reduces the defect density in the GaN layer 24 and subsequently grown epitaxial layers. 3) The buffer structure of the invention results in less complicated growth recipe. Proposed explanations for advantages 1-3 in the case of SiC are set forth as follows:

First, the buffer structure of the invention reduces the voltage at the SiC—GaN interface to a greater extent than do the gallium nitride dots capped with aluminum gallium nitride and followed by a continuous AlGaN layer set forth in the incorporated references. This is an empirically observed result, and, without being bound by any particular theory, appears to be the possible result of several factors. One explanation is associated with the built-in heterointerface voltage associated with the III-N/SiC interface in any vertical structure incorporating a buffer layer on SiC. This voltage tends to be lowest when the buffer layer is a continuous GaN layer (X=0) and highest when the buffer layer is a continuous AlN layer (X=1). It follows that when the buffer is discontinuous and consists of islands of GaN and AlGaN, the built-in voltage will lie somewhere between the two extremes. In dots/cap/continuous AlGaN buffer, the majority of the SiC surface is covered with AlGaN. Thus, the heterointerface voltage is primarily determined by the composition of the continuous AlGaN buffer, with some decrease due to the presence of the GaN dots. In the discontinuous buffer structure, a large fraction of the SiC substrate 21 surface is covered with GaN layer 24. Thus, the heterointerface voltage is primarily determined by the GaN/SiC built-in voltage with a slight increase due to the presence of the discontinuous AlGaN layer 22 in contact with the SiC substrate 21. It follows that the lowest voltages are expected for the lowest Al mole fractions in the AlGaN layer 22. A second possible reason for the lower voltages associated with this buffer when compared with the dots/cap/continuous AlGaN buffer referred to in the incorporated references could result from the quality of the GaN layer as specified in this invention. As described earlier, the epitaxial growth conditions of the GaN layer are chosen so as to promote lateral growth of the GaN layer 24 off of the growth planes of the discontinuous AlGaN layer 22 not parallel to the SiC substrate 21. GaN grown in this way, when doped with an impurity such as Si, tends to be more conductive than GaN grown in a more vertical fashion.

Second, the buffer structure of the invention reduces the defect density in the GaN layer 24 and subsequently grown epitaxial layers. Typically, this type of defect reduction can only be done in III-N epitaxial layers deposited on SiC, $Al_2O_3$, or other suitable substrate through the use of a 'mask' deposited ex-situ or via the incorporation of an in-situ deposited mask such as $Si_xN_y$. However, as noted earlier and above, in the buffer described here, the epitaxial growth conditions of the GaN layer 24 are chosen so as to promote lateral growth of the GaN layer 24 off of the growth planes of the discontinuous AlGaN layer 22 not parallel to the SiC substrate 21. This tends to discourage defects originating at the substrate/III-N interface from propagating vertically through GaN layer and into subsequent layers which can include the light emitting layers in LED structures. Further, as noted earlier, the buffer of the invention permits a thicker gallium nitride layer to be grown without the cracking that otherwise tends to takes place. In turn, a thicker gallium nitride layer allows a greater reduction in a dislocation density because the dislocations tend to decrease as the thickness of the gallium nitride layer increases. The ability of this buffer to reduce the defect density can be exploited in, for example, III-N based ultraviolet LEDs and LDs whose performance is enhanced as the epitaxial layer defect density is reduced.

Third, perhaps in its simplest and yet most advantageous aspect, the invention eliminates several layers in comparison to previous buffer structures. Accordingly, the buffer structure of the invention can result in less complicated growth recipe than those in the incorporated references. Specifically, the buffer described here is comprised of a single AlGaN layer. In comparison, the dots/cap/continuous buffer consists of 3 layers. Although a seemingly small difference, the reduced number of recipe parameters can simplify any manufacturing process based on the new buffer structure. Such a reduction eases the complexity of the overall manufacturing technique with an accompanying decrease in the likelihood of problems or errors.

Thus, in short and somewhat simplified summary, the goal and advantages of the invention are to propagate lateral growth of gallium nitride adjacent to substrates and adjacent the aluminum gallium nitride layer 22 in order to avoid propagating the vertical growing defects into the gallium nitride layer 24 and to reduce the voltage associated with vertical devices such as LEDs fabricated on the GaN template.

Although the buffer structure has been described in the examples with respect to silicon carbide, it is expected to work in the same manner on sapphire or other suitable substrate for III-N based materials and offer similar advantages, the only differences being that sapphire-based substrates cannot be made conductive, and thus do not support vertically oriented devices, reducing but not eliminating the voltage reduction expected on the insulating substrate.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A semiconductor photonic device comprising:
   a conductive silicon carbide substrate;
   a buffer structure on said conductive silicon carbide substrate formed of a discontinuous aluminum gallium nitride layer and a continuous gallium nitride layer directly on said discontinuous aluminum gallium nitride layer, said continuous gallium nitride layer having a thickness that functionally minimizes the number of defects propagated through it;
   said discontinuous aluminum gallium nitride layer having a mole fraction of aluminum large enough to facilitate initial nucleation of said discontinuous aluminum gallium nitride layer on said substrate but less than an amount that would cause a continuous layer of aluminum gallium nitride to form; and
   at least two doped Group III nitride layers on said buffer structure, said layers being of opposite conductivity type from one another for providing electrons and holes that combine to generate an emission from said device when current is applied to said device.

2. A photonic device according to claim 1 further comprising a dielectric layer on the top portions of said doped Group III nitride layers.

3. A photonic device according to claim 2 wherein said dielectric layer comprises silicon nitride.

4. A photonic device according to claim 1 having a vertical orientation with an ohmic contact to one of said doped layers and another ohmic contact to said conductive silicon carbide substrate.

5. A photonic device according to claim 1 further comprising a superlattice above said buffer structure for encouraging and supporting favorable crystal growth and better transitions between and among the layers of said device.

6. A photonic device according to claim 1 further comprising a quantum well above said buffer structure for increasing the efficiency of the device by progressively collecting the carriers in the quantum well.

7. A photonic device according to claim 1 further comprising a multiple quantum well above said buffer structure for increasing the efficiency of the device by progressively collecting the carriers in the quantum well.

8. A device according to claim 1 wherein the mole fraction of aluminum is between about 0.02 and 0.30.

9. A device according to claim 1 wherein the mole fraction of aluminum is about 0.10.

10. A device according to claim 1 wherein said discontinuous aluminum gallium nitride layer is sufficiently thick to provide a surface discrimination between itself and said substrate with respect to the nucleation of gallium nitride but less than the thickness that would mimic a full aluminum gallium nitride epitaxial layer.

11. A device according to claim 1 in which said discontinuous aluminum gallium nitride layer is between about 500 and 10,000 angstroms thick.

12. A device according to claim 1 wherein said discontinuous aluminum gallium nitride layer has a thickness of about 1500 angstroms.

13. A device according to claim 1 wherein said continuous gallium nitride layer has a thickness of a between about 5,000 and 50,000 angstroms.

14. A device according to claim 1 wherein said continuous gallium nitride layer has a thickness of about 25,000 angstroms.

15. A semiconductor photonic device comprising:
   a substrate selected from the group consisting of sapphire and gallium nitride;
   a buffer structure on said substrate formed of a discontinuous aluminum gallium nitride layer and a continuous gallium nitride layer directly on said discontinuous aluminum gallium nitride layer, said continuous gallium nitride layer having a thickness that functionally minimizes the number of defects propagated through it;
   said discontinuous aluminum gallium nitride layer having a mole fraction of aluminum large enough to facilitate initial nucleation of said discontinuous aluminum gallium nitride layer on said substrate but less than an amount that would cause a continuous layer of aluminum gallium nitride to form; and
   at least two doped Group III nitride layers on said buffer structure, said layers being of opposite conductivity type from one another for providing electrons and holes that combine to generate an emission from said device when current is applied to said device.

16. A photonic device according to claim 15 further comprising a dielectric layer on the top portions of said doped Group III nitride layers.

17. A photonic device according to claim 16 wherein said dielectric layer comprises silicon nitride.

18. A photonic device according to claim 15 further comprising a superlattice above said buffer structure for encouraging and supporting favorable crystal growth and better transitions between and among the layers of said device.

19. A photonic device according to claim 15 further comprising a quantum well above said buffer structure for increasing the efficiency of the device by progressively collecting the carriers in the quantum well.

20. A photonic device according to claim 15 further comprising a multiple quantum well above said buffer structure for increasing the efficiency of the device by progressively collecting the carriers in the quantum well.

21. A device according to claim 15 herein the mole fraction of aluminum is between about 0.02 and 0.30.

22. A device according to claim 15 wherein the mole fraction of aluminum is about 0.10.

23. A device according to claim 15 wherein said discontinuous aluminum gallium nitride layer is sufficiently thick to provide a surface discrimination between itself and said substrate with respect to the nucleation of gallium nitride but less than the thickness that would mimic a full aluminum gallium nitride epitaxial layer.

24. A device according to claim 15 in which said discontinuous aluminum gallium nitride layer is between about 500 and 10,000 angstroms thick.

25. A device according to claim 15 wherein said discontinuous aluminum gallium nitride layer has a thickness of about 1500 angstroms.

26. A device according to claim 15 wherein said continuous gallium nitride layer has a thickness of a between about 5,000 and 50,000 angstroms.

27. A device according to claim 15 wherein said continuous gallium nitride layer has a thickness of about 25,000 angstroms.

28. A semiconductor photonic device comprising:
   a substrate;
   a buffer structure on said substrate formed of a discontinuous aluminum gallium nitride layer and a continuous gallium nitride layer directly on the discontinuous aluminum gallium nitride layer, said continuous gallium nitride layer having a thickness that functionally minimizes the number of defects propagated through it;
   said discontinuous aluminum gallium nitride layer having a mole fraction of aluminum large enough to facilitate initial nucleation of the discontinuous aluminum gallium nitride layer on the substrate but less than an amount that would cause a continuous layer of aluminum gallium nitride to form; and
   at least two doped Group III nitride layers on said buffer structure, said layers being of opposite conductivity type from one another for providing electrons and holes that combine to generate an emission from said device when current is applied to said device.

* * * * *